(12) United States Patent
Hirano (10) Patent No.: US 9,713,268 B2
(45) Date of Patent: Jul. 18, 2017

(54) MANUFACTURING METHOD FOR ELECTRONIC DEVICE

(71) Applicant: Panasonic Corporation, Osaka (JP)

(72) Inventor: Koichi Hirano, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 131 days.

(21) Appl. No.: 14/593,351

(22) Filed: Jan. 9, 2015

(65) Prior Publication Data

US 2015/0208513 A1 Jul. 23, 2015

(30) Foreign Application Priority Data

Jan. 23, 2014 (JP) ................. 2014-010589

(51) Int. Cl.
| | |
|---|---|
| B05D 5/12 | (2006.01) |
| H05K 3/00 | (2006.01) |
| H05K 3/46 | (2006.01) |
| H05K 3/12 | (2006.01) |
| B05D 7/00 | (2006.01) |
| B05D 1/36 | (2006.01) |
| B05D 1/28 | (2006.01) |
| B41F 7/02 | (2006.01) |

(52) U.S. Cl.
CPC ......... *H05K 3/4664* (2013.01); *H05K 3/1275* (2013.01); *B05D 1/28* (2013.01); *B05D 1/36* (2013.01); *B05D 5/12* (2013.01); *B05D 7/50* (2013.01); *B41F 7/02* (2013.01); *H05K 2203/0108* (2013.01); *H05K 2203/0143* (2013.01); *H05K 2203/0537* (2013.01); *H05K 2203/1461* (2013.01)

(58) Field of Classification Search
USPC .............. 427/97.2, 97.3, 97.7, 98.4, 558
See application file for complete search history.

(56) References Cited

U.S. PATENT DOCUMENTS

| | | | | |
|---|---|---|---|---|
| 6,109,175 A | * | 8/2000 | Kinoshita | ............ B41M 1/10 101/170 |
| 7,494,695 B2 | * | 2/2009 | Oh | ............ H05K 3/1275 427/420 |
| 7,579,043 B2 | * | 8/2009 | Oh | ............ G02F 1/13394 349/187 |
| 7,658,147 B2 | * | 2/2010 | Chung | ............ B41F 3/36 101/423 |

(Continued)

FOREIGN PATENT DOCUMENTS

| | | |
|---|---|---|
| JP | 58-082598 | 5/1983 |
| JP | 2005-085843 | 3/2005 |

(Continued)

*Primary Examiner* — Brian K Talbot
(74) *Attorney, Agent, or Firm* — McDermott Will & Emery LLP (57) ABSTRACT

A manufacturing method for an electronic device according to the present disclosure includes (i) forming an insulating film on a surface of a cylinder, (ii) forming the insulating film having a via hole on the surface of the cylinder by pressing a relief member against the insulating film to remove a portion of the insulating film facing a protrusion of the relief member, and (iii) providing a precursor of an insulating layer having the via hole filled with conductive ink on a wiring substrate, wherein the via hole faces a wiring of the wiring substrate.

11 Claims, 7 Drawing Sheets

(56) References Cited

U.S. PATENT DOCUMENTS

| | | | | |
|---|---|---|---|---|
| 7,987,782 B2* | 8/2011 | Kim | ................ | B41F 3/36 |
| | | | | 101/217 |
| 2004/0145858 A1* | 7/2004 | Sakurada | ............ | H05K 3/4647 |
| | | | | 361/600 |
| 2004/0206457 A1* | 10/2004 | Asai | ................ | H05K 3/00 |
| | | | | 156/384 |
| 2007/0059440 A1* | 3/2007 | Park | ................ | C23C 26/00 |
| | | | | 427/98.4 |
| 2007/0128855 A1* | 6/2007 | Cho | ................ | H05K 3/4664 |
| | | | | 438/637 |
| 2007/0295688 A1* | 12/2007 | Kim | ................ | G02F 1/1333 |
| | | | | 216/54 |
| 2008/0008824 A1 | 1/2008 | Cho et al. | | |
| 2009/0208661 A1* | 8/2009 | Kim | ................ | B41F 3/36 |
| | | | | 427/428.01 |
| 2009/0318591 A1* | 12/2009 | Ageishi | ................ | B41J 2/0057 |
| | | | | 524/88 |
| 2010/0065986 A1 | 3/2010 | Nakamura et al. | | |
| 2012/0097059 A1* | 4/2012 | Allemand | ............... | C09D 11/52 |
| | | | | 101/483 |
| 2013/0031781 A1* | 2/2013 | Lee | ................ | G06F 3/044 |
| | | | | 29/881 |
| 2013/0068723 A1 | 3/2013 | Stay et al. | | |

FOREIGN PATENT DOCUMENTS

| | | |
|---|---|---|
| JP | 2007-076358 | 3/2007 |
| JP | 2007-273712 | 10/2007 |
| JP | 2008-022002 | 1/2008 |
| JP | 2008-103641 | 5/2008 |
| JP | 2008-114250 | 5/2008 |
| JP | 2013-516764 | 5/2013 |
| KR | 10-2008-0073386 | * 8/2008 |
| WO | 2007/114342 | 10/2007 |

* cited by examiner

MANUFACTURING METHOD FOR ELECTRONIC DEVICE

This Application claims priority to Japanese Patent Application No. 2014-010589, filed on Jan. 23, 2014, the contents of which are hereby incorporated by reference.

BACKGROUND

1. Technical Field

The present disclosure relates to a manufacturing method for an electronic device.

2. Description of the Related Art

In recent years, there has been an increasing demand for a reduction in size and thickness and improvement in function of electronic devices. To meet this demand, a multilayer wiring substrate is used which realizes an increase in degree of layout freedom and a reduction in size of functional elements forming an electronic device. The multilayer wiring substrate is a built-up thin film layer in which insulating layers and wirings are alternately laminated on a core board. The insulating layers include therein connection vias. The wirings are provided upper portions of the insulating layers, and interconnected via the connection vias in the insulating layers.

Japanese Unexamined Patent Application Publication No. 2008-114250 discloses a method of irradiating conductor layers and insulating layers with laser beams to ultimately form a multilayer wiring substrate without using photoresist. Further, Japanese Unexamined Patent Application Publication No. 2007-273712 discloses a printing method. The method includes: applying ink to a blanket to form an ink applied surface; pressing a relief against the ink applied surface to remove portions of the ink contacting the relief from the blanket; and thereafter transferring the ink remaining on the blanket onto a print target object. Japanese Unexamined Patent Application Publication No. 2007-273712 also indicates that, when multiple layers of ink patterns are formed, an insulating layer forming a second layer is laminated to overlie a wiring forming a first layer.

SUMMARY

The present disclosure provides a manufacturing method for an electronic device capable of improving the reliability of connection between wirings by using a simple method.

According to an embodiment of the present disclosure, a manufacturing method for an electronic device includes (i) forming an insulating film on a surface of a cylinder, (ii) forming the insulating film having a via hole on the surface of the cylinder by pressing a relief member against the insulating film to remove a portion of the insulating film facing a protrusion of the relief member, and (iii) providing a precursor of an insulating layer having the via hole filled with conductive ink on a wiring substrate, wherein the via hole faces a wiring of the wiring substrate.

A manufacturing method for an electronic device according to the present disclosure is capable of improving the reliability of electrical connection.

DETAILED DESCRIPTION OF THE EMBODIMENTS

Findings as a Basis for the Present Disclosure

The present inventors have found that, according to the method disclosed in Japanese Unexamined Patent Application Publication No. 2008-114250, removed substances resulting from the irradiation with laser beams adhere to surfaces of the insulating layers. The substances thereby contaminate the wirings formed on the connection vias in the insulating layers, causing the possibility of a failure of electrical connection between the wirings via the connection vias.

The present inventors have also found that, according to Japanese Unexamined Patent Application Publication No. 2007-273712, it is difficult to electrically connect the wirings via the connection vias in the insulating layers since the insulating layer forming the second layer is laminated to overlie the wiring forming the first layer.

The present inventors have arrived at embodiments according to the present disclosure based on the above-described findings.

Manufacturing Methods according to the Present Disclosure

Description will be given below of manufacturing methods for an electronic device according to embodiments of the present disclosure.

In the present specification, "an electronic device" practically refers to a multilayer wiring substrate, and in a narrower sense to a combination of a multilayer wiring substrate and functional elements provided on the multilayer wiring substrate. Further, in the present specification, "a multilayer wiring substrate" refers to a completed product "ultimately" obtained by a manufacturing method for an electronic device according to one of first to fourth embodiments of the present disclosure described below. Further, in the present specification, "a wiring substrate" refers not only to a combination of a core board and one wiring provided on the core board along a laminating direction (corresponding to the first and second embodiments) but also to a combination of a core board and two or more wirings provided on the core board along the laminating direction (corresponding to the third and fourth embodiments) other than the above-defined "multilayer wiring substrate." Further, in the present specification, "a manufacturing method for an electronic device according to the present disclosure" includes the manufacturing method for an electronic device according to the first embodiment of the present disclosure and the manufacturing method for an electronic device according to the second embodiment of the present disclosure, which will be described below. Further, in the present specification, "a precursor of an insulating layer" refers to an insulating film having at least one via hole filled with conductive ink.

The manufacturing method for an electronic device according to the first embodiment of the present disclosure will first be described. The manufacturing method for an electronic device according to the first embodiment of the present disclosure includes the following steps.

Step of Forming an Insulating Film

Figure 1A:
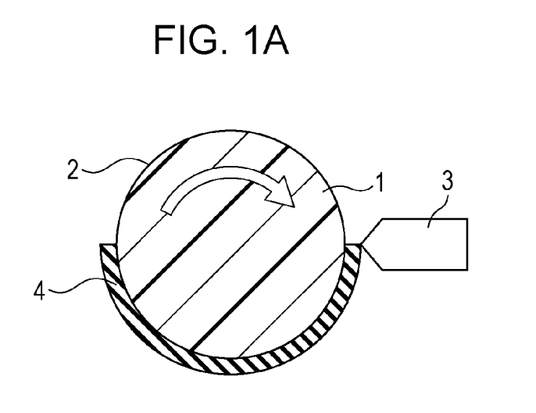
FIGS. 1A to 1E are schematic flow diagrams illustrating a manufacturing method according to a first embodiment of the present disclosure.

As illustrated in FIG. 1A, an insulating material is first applied to a surface 2 of a cylinder 1 by use of a coating apparatus 3 to form an insulating film 4. In this process, the insulating film 4 may be formed on all or a part of the surface 2 of the cylinder 1. As a material of the cylinder 1, a material may be used which (1) allows the insulating material to be uniformly applied to the surface 2 and (2) allows protrusions 6 of a later-described relief member 5 to press the insulating film 4 formed on the cylinder 1 to remove portions of the insulating film 4 facing the protrusions 6 of the relief member 5.

Specifically, a material of the cylinder 1 may be a silicone resin, a fluororesin, polyolefin, or a styrene-based elastomer, and particularly polydimethylsiloxane (PDMS) having an excellent mold-releasing characteristic, flexibility, and durability. In the cylinder 1, the above-described material may be included in the surface 2, to which the insulating material is applied. In this case, a rubber for increasing the flexibility and/or a resin film for bonding purposes, for example, may be used inside the cylinder 1.

Further, the insulating material applied to the surface 2 of the cylinder 1 may be any insulative material. The insulating material is not particularly limited. For example, the insulating material may be a mixture of (1) one or at least two selected from a group of an epoxy resin, a phenol resin, a polyimide resin, a polyvinyl phenol resin, a polyvinylpyrrolidone resin, a polyvinyl alcohol-based resin, a polyacrylnitrile-based resin, a methacrylic resin, a polyamide-imide resin, a fluororesin, a melamine resin, a urethane resin, a polyester resin, polyvinylidene fluoride, a polyvinyl acetate resin, a silicone resin, an acrylic resin, and a polyolefin resin, and (2) a solvent such as water, a hydrocarbon system solvent, an alcohol-based solvent, a ketone-based solvent, an ether-based solvent, an ester-based solvent, or a glycoletherbased solvent. Further, an inorganic filler may be added to the insulating material. The inorganic filler may be alumina particles, silica particles, tantalum oxide particles, or the like. A surfactant or a dispersant may further be added to the insulating material.

The coating apparatus 3 is not particularly limited. The coating apparatus 3 may be any apparatus capable of uniformly applying the insulating material to the surface 2 of the cylinder 1, such as a slot die coater, a cap coater, a spray coater, a roll coater, or a bar coater, for example. The coating apparatus 3 may be appropriately provided, in accordance with the type thereof, at a position at which the coating apparatus 3 is capable of uniformly applying the insulating material to the surface 2 of the cylinder 1.

Step of Forming an Insulating Film Having Via Holes

Figure 1B:
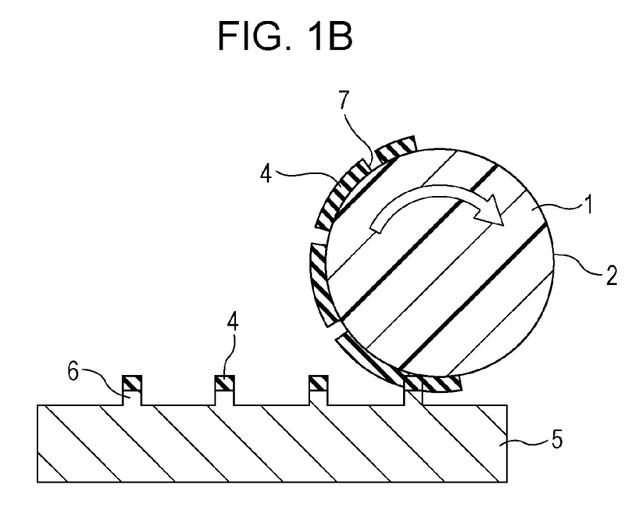

As illustrated in FIG. 1B, the cylinder 1 having the insulating film 4 is then rotated in one direction on the relief member 5 having a surface provided with the protrusions 6 to press the relief member 5 against the insulating film 4. Thereby, the portions of the insulating film 4 facing the protrusions 6 of the relief member 5 are removed. Specifically, the portions of the insulating film 4 facing the protrusions 6 of the relief member 5 are removed to expose the surface 2 of the cylinder 1.

Consequently, the removed portions of the insulating film 4 are transferred to the protrusions 6 of the relief member 5, whereas the insulating film 4 partially exposing the surface 2 of the cylinder 1 is formed on the surface 2 of the cylinder 1. The portions of the insulating film 4 exposing the surface 2 of the cylinder 1 are capable of functioning as via holes for providing later-described connection vias. That is, the insulating film 4 having via holes 7 for providing later-described connection vias is formed in the present step.

With the present step, the portions of the insulating film 4 facing the protrusions 6 of the relief member 5 are removed with the relief member 5 pressed against the insulating film 4. The via holes 7 are therefore formed more easily than when formed with a laser or the like. The insulating film 4 having the via holes 7 may be subjected to heat treatment, ultra-violet irradiation, or electron beam irradiation to be set. Thereby, the shape of the insulating film 4 is maintained, and compatibilization between the insulating film 4 and later-described conductive ink 9 filling the via holes 7 is suppressed.

The protrusions 6 of the relief member 5 are thicker than the portions of the insulating film 4 facing the protrusions 6 of the relief member 5. Accordingly, the portions of the insulating film 4 facing the protrusions 6 of the relief member 5 are reliably removed to expose the surface 2 of the cylinder 1. Further, the shape of the protrusions 6 of the relief member 5 is not particularly limited. The protrusions 6 may have any shape corresponding to the desired shape of the via holes 7, such as a column, a quadrangular prism, or a combination of a column and a quadrangular prism, for example.

A material of the protrusions 6 of the relief member 5 may be a silicon wafer, an inorganic compound such as silica glass, alkali-free glass, or soda glass, a metal such as nickel, copper, or stainless steel, or a resin. Further, a method of forming the protrusions 6 of the relief member 5 is not particularly limited, and may be etching, molding, electroforming, or the like performed on a flat member by a chemical or physical method.

Step of Forming a Precursor of an Insulating Layer (Step of Filling the Via Holes with Conductive Ink)

Figure 1C:
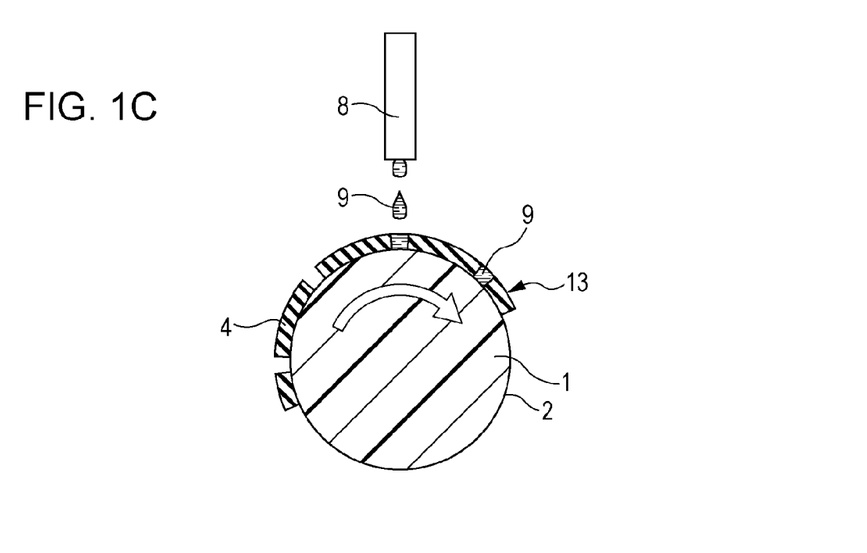

As illustrated in FIG. 1C, the via holes 7 in the insulating film 4 formed on the surface 2 of the cylinder 1 are then filled with the conductive ink 9 by use of an inking device 8. Herein, "filling the via holes 7 with the conductive ink 9" refers to airtightly fill the via holes 7 with the conductive ink 9. Accordingly, the via holes 7 in the insulating film 4 are airtightly and accurately filled with the conductive ink 9 with the position and amount of the conductive ink 9 appropriately adjusted. Consequently, a precursor 13 of a later-described insulating layer is formed on the surface 2 of the cylinder 1.

The inking device 8 is not particularly limited, and may be any device capable of accurately filling the via holes 7 with the conductive ink 9, such as an ink jet device, a spray device, or a dispenser, for example. The ink jet device, for example, is capable of highly accurately filling the via holes 7 with the conductive ink 9.

The conductive ink 9 is a solvent dispersed with, for example, metal particles of a metal (such as one selected from a group of gold, silver, copper, nickel, zinc, aluminum, tin, iron, indium, platinum, palladium, or chromium), alloy particles including the metal particles of at least two metals selected from the above group, or conductive oxide particles. The conductive oxide particles are made of zinc oxide (ZnO), tin oxide (SnO), indium tin oxide (ITO), fluorine-doped tin oxide (FTC), or the like. Further, the conductive ink 9 may also include, for example, organic metal salts such as conductive organic metal complexes and conductive polymers subjected to pyrolysis at a relatively low temperature. The conductive polymers may be polyethylenedioxythiophene, polystyrenesulfonic acid, polyaniline, or the like.

For example, the conductive ink 9 may further include silver nano particles, conductivity of which are improved by low-temperature firing.

Step of Placing the Precursor of the Insulating Layer

Figure 1D:
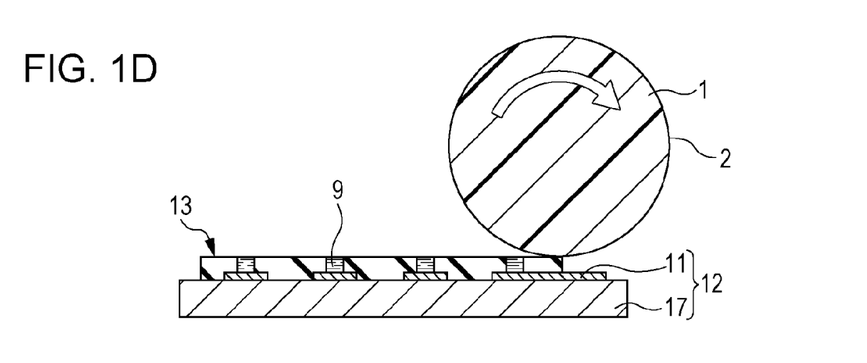

As illustrated in FIG. 1D, the cylinder 1 is then rotated on a wiring substrate 12, in a direction parallel to the longitudinal direction of the wiring substrate 12, to thereby provide the wiring substrate 12 with the precursor 13 of the insulating layer formed on the surface 2 of the cylinder 1. The wiring substrate 12 includes a core board 17 and a wiring 11 provided on the core board 17. Specifically, the cylinder 1 is rotated in the direction parallel to the longitudinal direction of the wiring substrate 12 with the via holes 7 filled with the conductive ink 9 aligned to face the wiring 11. Thereby, the precursor 13 of the insulating layer is gradually transferred onto the wiring substrate 12 from the surface 2 of the cylinder 1 to provide the precursor 13 of the insulating layer on the wiring substrate 12.

In the present step, the cylinder 1 has functions of (1) rotating on the wiring substrate 12 in the direction parallel to the longitudinal direction of the wiring substrate 12 to gradually transfer the precursor 13 of the insulating layer onto the wiring substrate 12, and (2) pressing the wiring substrate 12 and the precursor 13 of the insulating layer. With these functions, the adhesion between the wiring substrate 12 and the precursor 13 of the insulating layer is improved. Accordingly, the reliability of connection between the wiring substrate 12 and an insulating layer 14 ultimately obtained is improved. Further, with these functions, a surface of the precursor 13 of the insulating layer is made substantially flat. That is, a surface of the insulating film 4 and the upper surface of the conductive ink 9 filling the via holes 7 are made substantially flush with each other.

Step of Forming the Insulating Layer

Although not illustrated in FIGS. 1A to 1E, the precursor 13 of the insulating layer provided on the wiring substrate 12 is then subjected to heat treatment, ultra-violet irradiation, or electron beam irradiation to be set, specifically cured, to maintain the shape of the precursor 13 of the insulating layer. Thereby, the insulating layer 14 having connection vias 15 is formed. The present step does not need to be performed immediately after the step of placing the precursor of the insulating layer, and may be performed after a later-described step of forming a wiring (and/or at least one electrode). Further, the present step may be performed when a film of conductive ink is fired in the later-described step of forming a wiring (and/or at least one electrode).

Step of Forming a Wiring (And/or at least one Electrode)

Figure 1E:
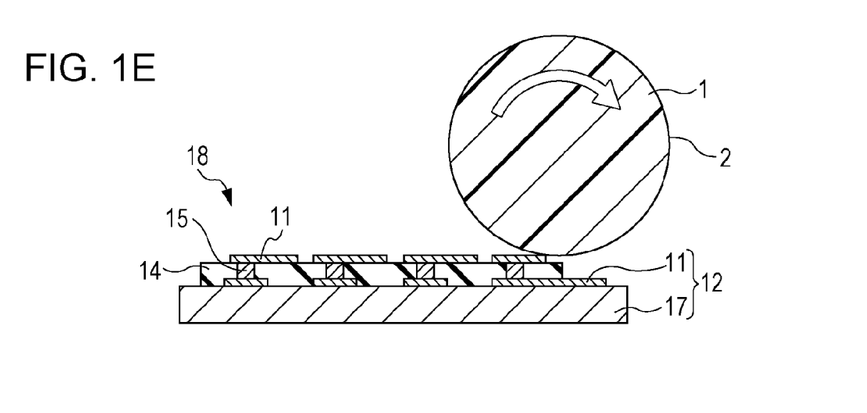

Finally, a wiring 11 and/or at least one electrode are/is formed on the connection vias 15. The via holes 7 are formed without a laser or the like in the above-described step of forming the insulating film 4 having the via holes 7. Thus, there is no adhesion of removed substances to a surface of the insulating layer 14. In the present step, therefore, the wiring 11 and/or the electrode formed on the connection vias 15 are/is unlikely to be contaminated. Accordingly, failure of electrical connection via the connection vias 15 between the wiring 11 provided on the core board 17 and the wiring 11 and/or the electrode provided on the connection vias 15 is suppressed.

As illustrated in FIG. 1E, the wiring 11 and/or the electrode may be formed on the connection vias 15 by use of the cylinder 1, for example, to improve the manufacturing efficiency. Specifically, conductive ink is applied to the surface 2 of the cylinder 1 by use of a coating apparatus to form a film of conductive ink. Then, the cylinder 1 having the film of conductive ink is rotated in one direction on a relief member having a surface provided with protrusions. Thereby, the relief member is pressed against the film of conductive ink, and thus portions of the film of conductive ink facing the protrusions of the relief member are removed. Then, the cylinder 1 is rotated in the direction parallel to the longitudinal direction of the wiring substrate 12 to provide, on the connection vias 15, the film of conductive ink formed on the surface 2 of the cylinder 1. Specifically, the cylinder 1 is rotated in the direction parallel to the longitudinal direction of the wiring substrate 12 with the film of conductive ink aligned to face the connection vias 15. Thereby, the film of conductive ink is gradually transferred onto the connection vias 15 from the surface 2 of the cylinder 1, and is provided on the connection vias 15. Finally, the film of conductive ink provided on the connection vias 15 is fired to form the wiring 11 and/or the electrode. The wiring 11 may also be formed on the core board 17 by use of the cylinder 1, for example, in accordance with a method similar to the above-described method of forming the wiring 11 and/or the electrode on the connection vias 15. Further, the method is not limited thereto. Thus, the wiring 11 and/or the electrode may be formed by a printing method such as screen printing, gravure printing, gravure offset printing, reverse offset printing, flexo printing, or an ink jet method. The wiring 11 and/or the electrode may also be formed by a vacuum film formation method (such as a sputtering method, a vacuum deposition method, or an ion plating method), an electrochemical method (such as plating), or a subtractive method (such as etching).

With the above-described steps, a multilayer wiring substrate 18, which is an electronic device, is manufactured by the manufacturing method for an electronic device according to the first embodiment of the present disclosure. In a narrower sense, the manufacturing method for an electronic device according to the first embodiment of the present disclosure further includes a step of placing functional elements, such as resistance elements, capacitive elements, and semiconductor elements, on the multilayer wiring substrate 18.

Description will now be given of a manufacturing method for an electronic device according to a second embodiment of the present disclosure.

The manufacturing method for an electronic device according to the second embodiment of the present disclosure includes the following steps. Characteristics, such as the material, shape, thickness, and size, of members employed in the manufacturing method for an electronic device according to the second embodiment of the present disclosure are the same as those in the manufacturing method for an electronic device according to the first embodiment of the present disclosure, and thus description thereof will be simplified or omitted.

Step of Forming an Insulating Film

Figure 2A:
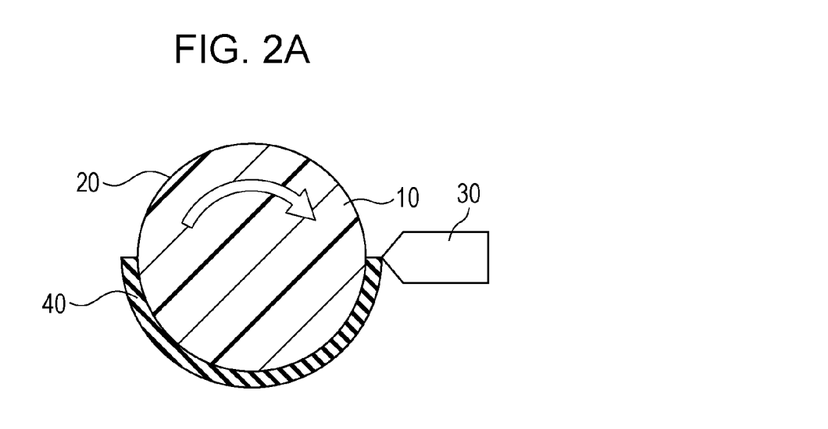
FIGS. 2A to 2E are schematic flow diagrams illustrating a manufacturing method according to a second embodiment of the present disclosure.

As illustrated in FIG. 2A, an insulating material is first applied to a surface 20 of a cylinder 10 by use of a coating apparatus 30 to form an insulating film 40.

Figure 2B:
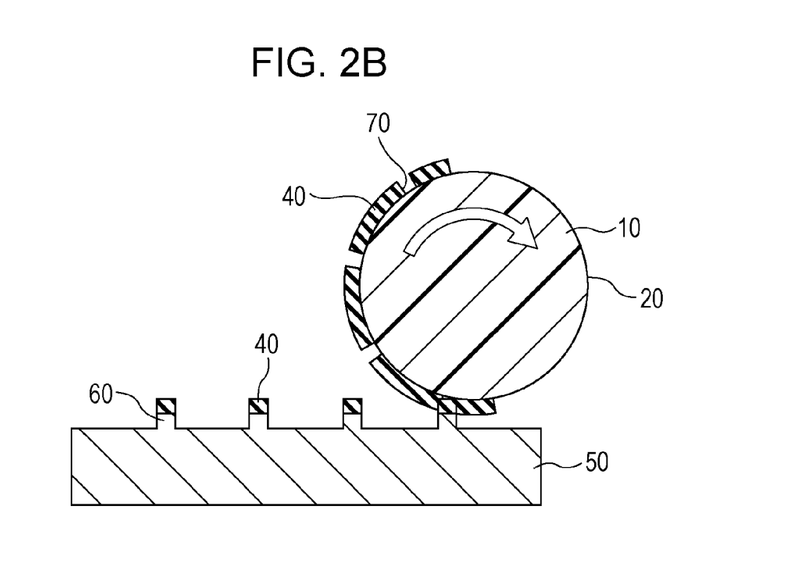

Step of Forming an Insulating Film Having Via Holes:

As illustrated in FIG. 2B, the cylinder 10 having the insulating film 40 is then rotated in one direction on a relief member 50 having a surface provided with protrusions 60 to press the relief member 50 against the insulating film 40. Thereby, portions of the insulating film 40 facing the protrusions 60 of the relief member 50 are removed. Specifically, the portions of the insulating film 40 facing the protrusions 60 of the relief member 50 are removed to expose the surface 20 of the cylinder 10. Thereby, the removed portions of the insulating film 40 are transferred to the protrusions 60 of the relief member 50, whereas the insulating film 40 partially exposing the surface 20 of the cylinder 10 is formed on the surface 20 of the cylinder 10. The portions of the insulating film 40 exposing the surface 20 of the cylinder 10 are capable of functioning as via holes for providing later-described connection vias. That is, the insulating film 40 having via holes 70 for providing the later-described connection vias is formed in the present step.

With the present step, the portions of the insulating film 40 facing the protrusions 60 of the relief member 50 are removed with the relief member 50 pressed against the insulating film 40. The via holes 70 are therefore formed more easily than when formed with a laser or the like. The insulating film 40 having the via holes 70 may be subjected to heat treatment, ultra-violet irradiation, or electron beam irradiation to be dried and set. Thereby, The shape of the insulating film 40 is maintained, and compatibilization between the insulating film 40 and later-described conductive ink 90 filling the via holes 70 is suppressed.

Step of Placing the Insulating Film Having the Via Holes

Figure 2C:
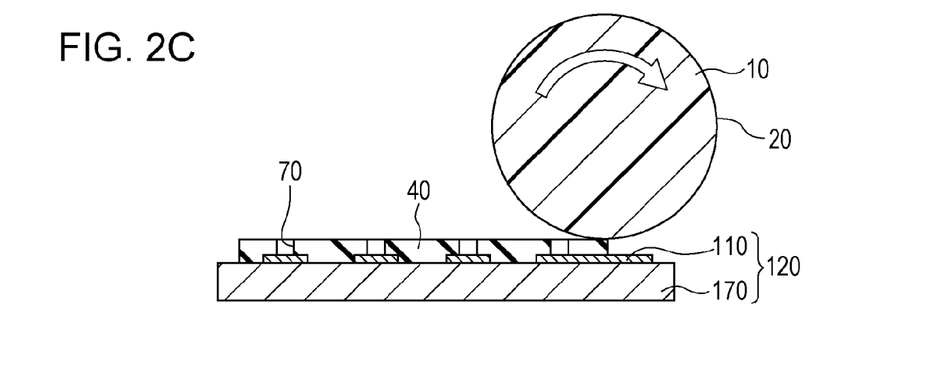

As illustrated in FIG. 2C, the cylinder 10 is then rotated on a wiring substrate 120, in a direction parallel to the longitudinal direction of the wiring substrate 120, to thereby provide the wiring substrate 120 with the insulating film 40 having the via holes 70 formed on the surface 20 of the cylinder 10. The wiring substrate 120 includes a core board 170 and a wiring 110 provided on the core board 170. Specifically, the cylinder 10 is rotated in the direction parallel to the longitudinal direction of the wiring substrate 120 with the via holes 70 aligned to face the wiring 110. Thereby, the insulating film 40 having the via holes 70 is gradually transferred onto the wiring substrate 120 from the surface 20 of the cylinder 10, and is provided on the wiring substrate 120. Although not illustrated in the drawings, the wiring 110 may be provided by use of the cylinder 10 to improve the manufacturing efficiency.

Step of Forming a Precursor of an Insulating Layer (Step of Filling the Via Holes with Conductive Ink)

Figure 2D:
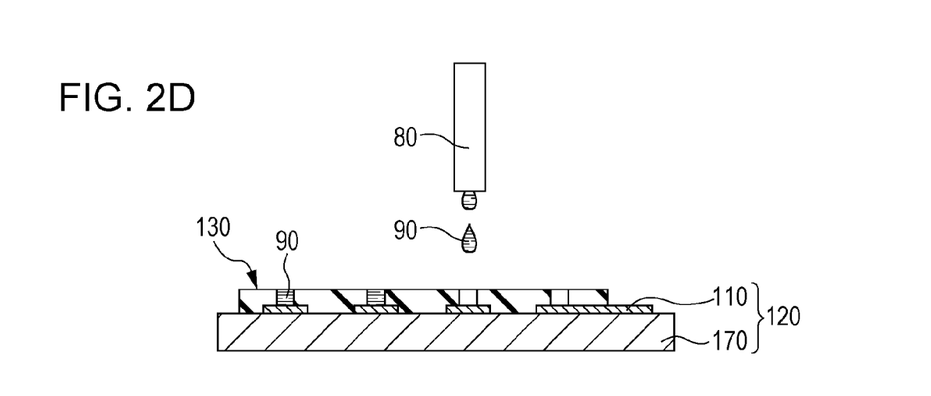

As illustrated in FIG. 2D, the via holes 70 in the insulating film 40 provided on the wiring substrate 120 are then filled with the conductive ink 90 by use of an inking device 80. Thereby, a precursor 130 of a later-described insulating layer is formed on the wiring substrate 120.

Herein, "filling the via holes 70 with the conductive ink 90" refers to airtightly filling the via holes 70 with the conductive ink 90. When the via holes 70 in the insulating film 40 provided on the wiring substrate 120 are filled with the conductive ink 90, the via holes 70 are airtightly and accurately filled with the conductive ink 90 with the position and amount of the conductive ink 90 for filling appropriately adjusted. Accordingly, the reliability of connection between the wiring substrate 120 and the precursor 130 of the insulating layer is improved. Consequently, the reliability of connection between the wiring substrate 120 and an insulating layer 140 ultimately obtained is improved.

Step of Forming the Insulating Layer

Although not illustrated in FIGS. 2A to 2E, the precursor 130 of the insulating layer provided on the wiring substrate 120 is subjected to heat treatment, ultra-violet irradiation, or electron beam irradiation to be set, specifically cured, to maintain the shape of the precursor 130 of the insulating layer. Thereby, the insulating layer 140 having connection vias 150 is formed. The present step does not need to be performed immediately after the step of forming a precursor of an insulating layer, and may be performed after a later-described step of forming a wiring (and/or at least one electrode). Further, the present step may be performed when a film of conductive ink is fired in the later-described step of forming a wiring (and/or at least one electrode).

Figure 2E:
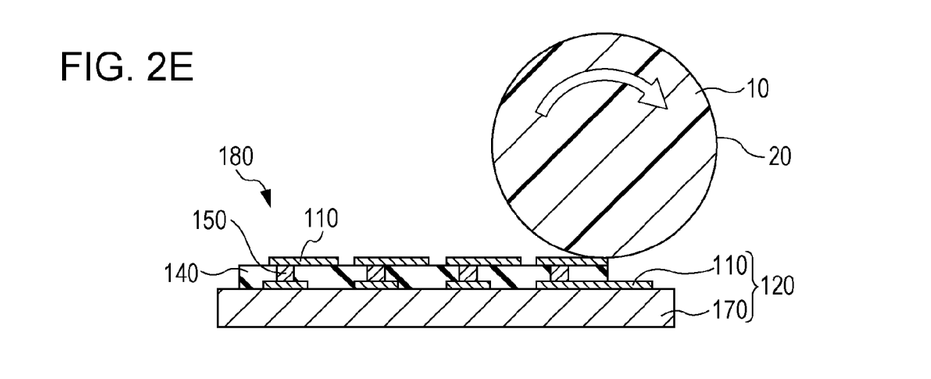

Step of Forming a Wiring (And/or at least one Electrode):

Finally, as illustrated in FIG. 2E, a wiring 110 and/or at least one electrode are/is formed on the connection vias 150. The wiring 110 and/or the electrode may be formed on the connection vias 150 by use of the cylinder 10, for example, to improve the manufacturing efficiency. Specifically, conductive ink is applied to the surface 20 of the cylinder 10 by use of the coating apparatus 30 to form a film of conductive ink. Then, the cylinder 10 having the film of conductive ink is rotated in one direction on the relief member 50 having the surface provided with the protrusions 60. Thereby, the relief member 50 is pressed against the film of conductive ink, and thus portions of the film of conductive ink facing the protrusions 60 of the relief member 50 are removed. Then, the cylinder 10 is rotated in the direction parallel to the longitudinal direction of the wiring substrate 120 to provide, on the connection vias 150, the film of conductive ink formed on the surface 20 of the cylinder 10. Specifically, the cylinder 10 is rotated in the direction parallel to the longitudinal direction of the wiring substrate 120 with the film of conductive ink aligned to face the connection vias 150. Thereby, the film of conductive ink is gradually transferred onto the connection vias 150 from the surface 20 of the cylinder 10, and is provided on the connection vias 150. Finally, the film of conductive ink provided on the connection vias 150 is fired to form the wiring 110 and/or the electrode. The wiring 110 may be formed on the core board 170 by use of the cylinder 10, for example, in accordance with a method similar to the above-described method of forming the wiring 110 and/or the electrode on the connection vias 150. Further, the method is not limited thereto. Thus, the wiring 110 and/or the electrode may be formed by a printing method (such as screen printing, gravure printing, gravure offset printing, reverse offset printing, flexo printing, or an ink jet method), a vacuum film formation method (such as a sputtering method, a vacuum deposition method, or an ion plating method), an electrochemical method (such as plating), or a subtractive method (such as etching).

In the present step, the cylinder 10 has main functions of (1) forming the wiring 110 and/or the electrode on the connection vias 150, and (2) pressing the wiring substrate 120, the insulating layer 140, and the wiring 110 and/or the electrode. Therefore, the adhesion between the wiring substrate 120, the insulating layer 140, and the wiring 110 and/or the electrode is improved. Accordingly, the reliability of connection between the wiring substrate 120 and the insulating layer 140 is further improved. Further, the reliability of connection between the wiring substrate 120, the insulating layer 140, and the wiring 110 and/or the electrode is improved.

Further, since the via holes 70 are formed without a laser or the like in the above-described step of forming the insulating film 40 having the via holes 70, there is no adhesion of removed substances to a surface of the insulating layer 140. In the present step, therefore, the wiring 110 and/or the electrode formed on the connection vias 150 are/is unlikely to be contaminated. Accordingly, failure of electrical connection via the connection vias 150 between the wiring 110 provided on the core board 170 and the wiring 110 and/or the electrode provided on the connection vias 150 is suppressed.

With the above-described steps, a multilayer wiring substrate 180, that is an electronic device, is manufactured by the manufacturing method for an electronic device according to the second embodiment of the present disclosure. In a narrower sense, the manufacturing method for an electronic device according to the second embodiment of the present disclosure further includes a step of placing functional elements, such as resistance elements, capacitative elements, and semiconductor elements, on the multilayer wiring substrate 180.

Description will now be given of a manufacturing method for an electronic device according to a third embodiment of the present disclosure.

The manufacturing method for an electronic device according to the third embodiment of the present disclosure is an embodiment in which a multilayer wiring substrate having three wirings provided via connection vias along a laminating direction is formed by a manufacturing method for an electronic device according to the present disclosure. Description will be given below of the embodiment in which a multilayer wiring substrate having three wirings provided via connection vias along a laminating direction is formed with the manufacturing method for an electronic device according to the first embodiment of the present disclosure. Description of parts overlapping with those described in the manufacturing method for an electronic device according to the first embodiment of the present disclosure will be simplified or omitted. Further, the manufacturing method for an electronic device according to the third embodiment of the present disclosure is not limited thereto. Thus, the multilayer wiring substrate having three wirings provided via connection vias along a laminating direction may be formed by the manufacturing method for an electronic device according to the second embodiment of the present disclosure.

Figure 3A:
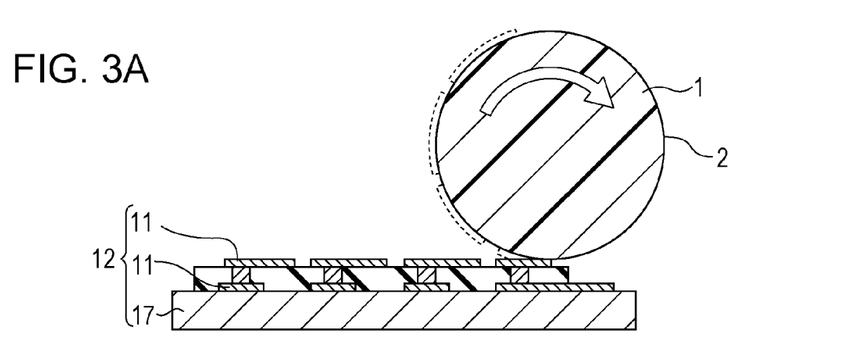
FIGS. 3A to 3C are schematic flow diagrams illustrating a manufacturing method according to a third embodiment of the present disclosure.

As described in FIG. 3A, the wiring substrate 12 having two wirings 11 provided on the core board 17 via the connection vias 15 along the laminating direction is first prepared by use of the cylinder 1 in accordance with the manufacturing method for an electronic device according to the first embodiment of the present disclosure.

Figure 3B:
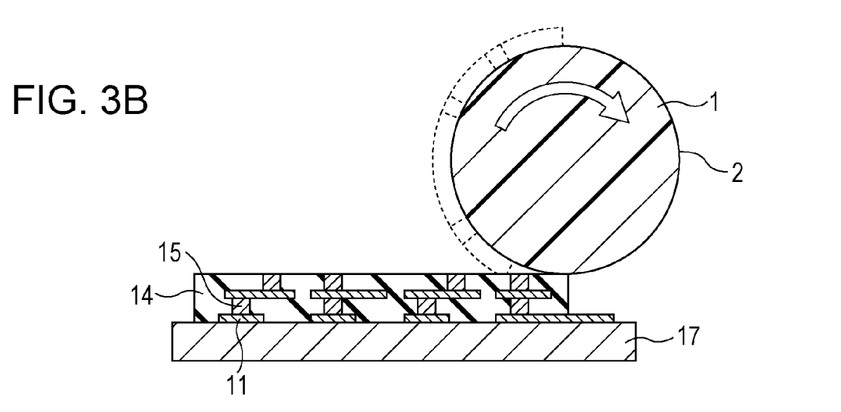

The above-described step is then followed by (1) the step of forming an insulating film, (2) the step of forming an insulating film having via holes, (3) the step of forming a precursor of an insulating layer (the step of filling the via holes with conductive ink), and (4) the step of placing the precursor of the insulating layer in the manufacturing method for an electronic device according to the first embodiment of the present disclosure. Thereafter, the precursor 13 of the insulating layer is subjected to heat treatment, ultra-violet irradiation, or electron beam irradiation to be set. Thereby, the insulating layer 14 having the connection vias 15 is further formed on the wiring substrate 12, as illustrated in FIG. 3B. The step of forming the insulating layer does not need to be performed immediately after the step of placing the precursor of the insulating layer, and may be performed after a later-described step of forming a wiring (and/or at least one electrode). Further, the present step may be performed when a film of conductive ink is fired in the later-described step of forming a wiring (and/or at least one electrode).

Figure 3C:
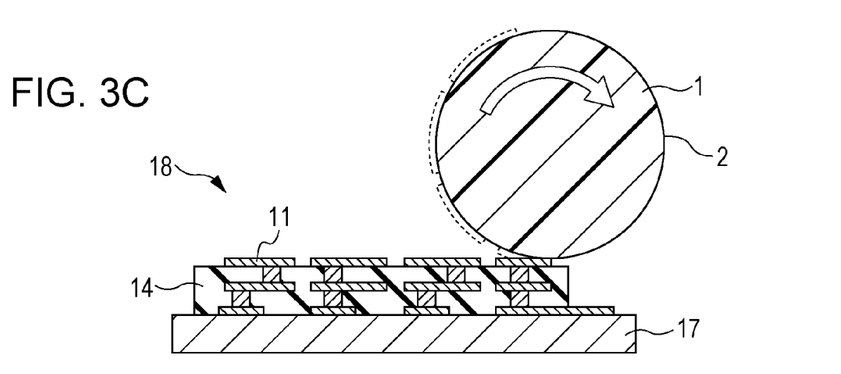

Finally, a wiring 11 and/or at least one electrode are/is formed on the connection vias 15, as illustrated in FIG. 3C. The wiring 11 and/or the electrode may be formed on the connection vias 15 by use of the cylinder 1, for example, to improve the manufacturing efficiency. Specifically, conductive ink is applied to the surface 2 of the cylinder 1 by use of the coating apparatus 3 to form a film of conductive ink. Then, the cylinder 1 having the film of conductive ink is rotated in one direction on the relief member 5 having the surface provided with the protrusions 6. Thereby, the relief member 5 is pressed against the film of conductive ink, and thus portions of the film of conductive ink facing the protrusions 6 of the relief member 5 are removed. Then, the cylinder 1 is rotated in the direction parallel to the longitudinal direction of the wiring substrate 12 to provide, on the connection vias 15, the film of conductive ink formed on the surface 2 of the cylinder 1. Finally, the film of conductive ink provided on the connection vias 15 is fired to form the wiring 11 and/or the electrode.

Thereby, the multilayer wiring substrate 18 having the wirings 11 provided via the connection vias 15 along the laminating direction is formed.

Description will now be given of a manufacturing method for an electronic device according to a fourth embodiment of the present disclosure.

The manufacturing method for an electronic device according to the fourth embodiment of the present disclosure is an embodiment in which a multilayer wiring substrate having at least four wirings provided via connection vias along the laminating direction is formed by a manufacturing method for an electronic device according to the present disclosure. Description will be given below of the embodiment in which a multilayer wiring substrate having at least four wirings provided via connection vias along the laminating direction is formed by the manufacturing method for an electronic device according to the first embodiment of the present disclosure. Description of parts overlapping with those described in the manufacturing method for an electronic device according to the first embodiment of the present disclosure will be simplified or omitted. Further, in the manufacturing method for an electronic device according to the fourth embodiment of the present disclosure, the multilayer wiring substrate having at least four wirings provided via connection vias along the laminating direction may be formed by the manufacturing method for an electronic device according to the second embodiment of the present disclosure.

Figure 4A:
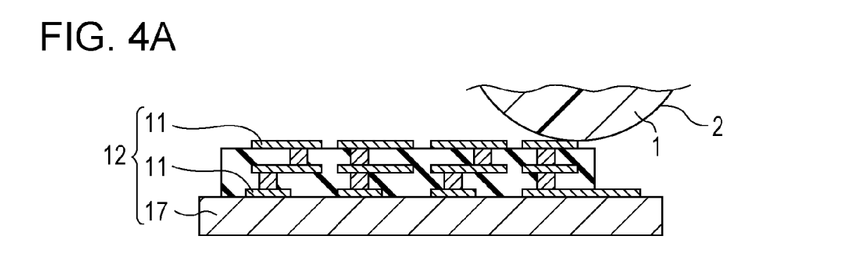
FIGS. 4A to 4F are schematic flow diagrams illustrating a manufacturing method according to a fourth embodiment of the present disclosure.

As described in FIG. 4A, the wiring substrate 12 having three wirings 11 provided on the core board 17 via the connection vias 15 along the laminating direction is first prepared by use of the cylinder 1 in accordance with the manufacturing method for an electronic device according to the first embodiment of the present disclosure.

Figure 4B:
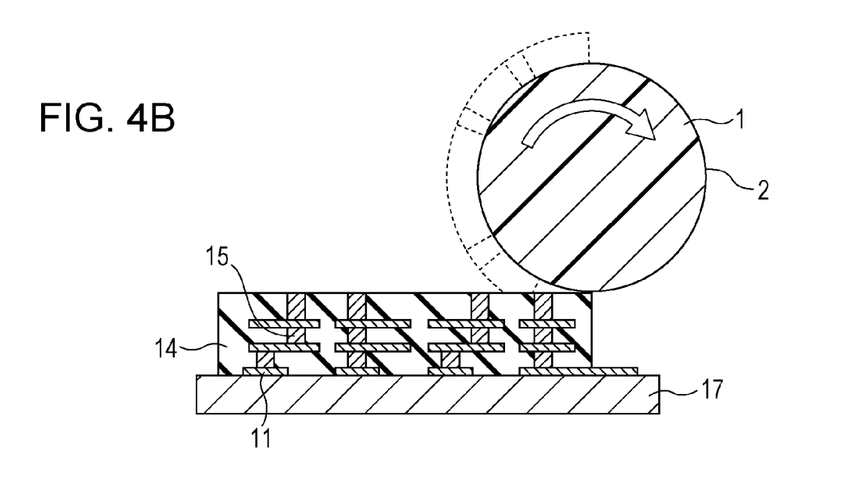

The above-described step is then followed by (1) the step of forming an insulating film, (2) the step of forming an insulating film having via holes, (3) the step of forming a precursor of an insulating layer (the step of filling the via holes with conductive ink), and (4) the step of placing the precursor of the insulating layer in the manufacturing method for an electronic device according to the first embodiment of the present disclosure. Thereafter, the precursor 13 of the insulating layer is subjected to heat treatment, ultra-violet irradiation, or electron beam irradiation to be set. Thereby, the insulating layer 14 having the connection vias 15 is further formed on the wiring substrate 12, as illustrated in FIG. 4B. The step of forming the insulating layer does not need to be performed immediately after the step of placing the precursor of the insulating layer, and may be performed after a later-described step of forming a wiring (and/or at least one electrode). Further, the present step may be performed when a film of conductive ink is fired in the later-described step of forming a wiring (and/or at least one electrode).

Figure 4C:
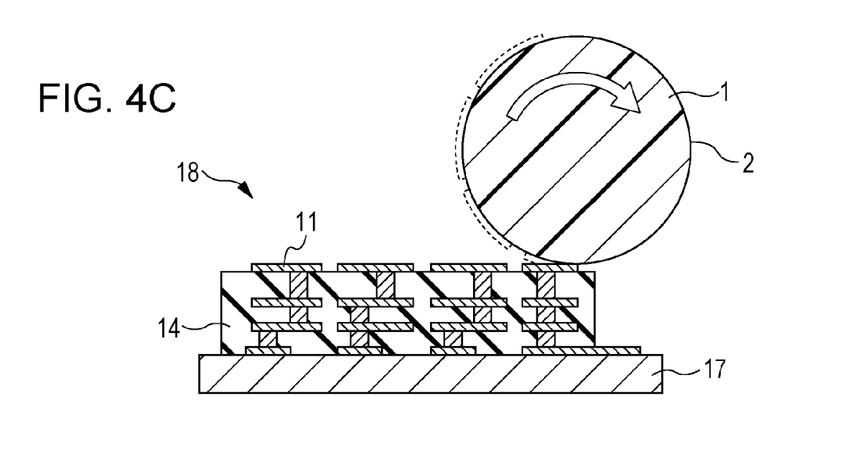

Finally, a wiring 11 and/or at least one electrode are/is formed on the connection vias 15, as illustrated in FIG. 4C. The wiring 11 and/or the electrode may be formed on the connection vias 15 by use of the cylinder 1, for example, to improve the manufacturing efficiency. Specifically, conductive ink is applied to the surface 2 of the cylinder 1 by use of the coating apparatus 3 to form a film of conductive ink. Then, the cylinder 1 having the film of conductive ink is rotated in one direction on the relief member 5 having the surface provided with the protrusions 6. Thereby, the relief member 5 is pressed against the film of conductive ink, and thus the portions of the film of conductive ink facing the protrusions 6 of the relief member 5 are removed. Then, the cylinder 1 is rotated in the direction parallel to the longitudinal direction of the wiring substrate 12 to provide, on the connection vias 15, the film of conductive ink formed on the surface 2 of the cylinder 1. Finally, the film of conductive ink provided on the connection vias 15 is fired to form the wiring 11 and/or the electrode.

Thereby, the multilayer wiring substrate 18 having four wirings 11 provided via the connection vias 15 along the laminating direction is formed.

Figure 4D:
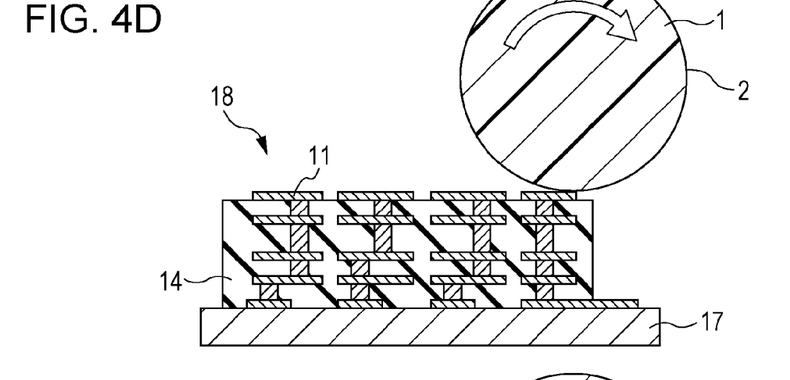
Figure 4E:
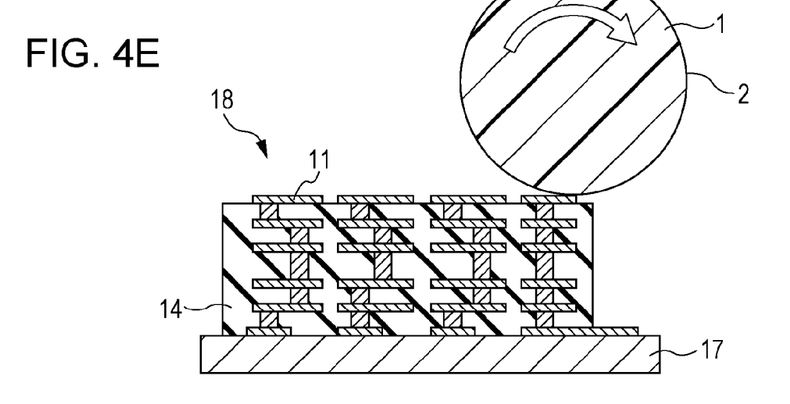
Figure 4F:
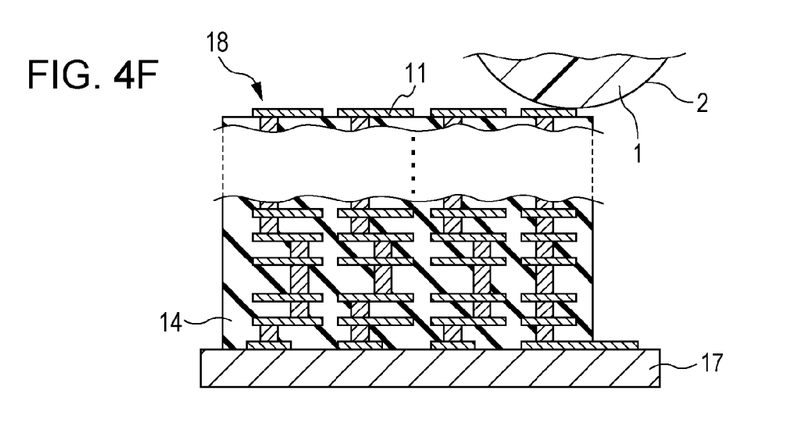

The number of wirings 11 provided via the connection vias 15 along the laminating direction is not particularly limited, and may be five, six, or any other plural number, as illustrated in FIGS. 4D, 4E, and 4F, respectively.

The foregoing description has been given of manufacturing methods for an electronic device according to embodiments of the present disclosure. The present disclosure, however, is not limited thereto. It is to be understood that the present disclosure may be modified in various ways by a person skilled in the art without departing from the disclosed scope specified in the following claims. For example, in the first to fourth embodiments, a plurality of via holes are provided. However, those embodiments are also applicable to a case of only one via hole. In this case, a relief member having a surface provided with one protrusion is used. In the first to fourth embodiments, the relief members that are used to provide each layer of the electronic device is indicated by the same reference number. However, of course, those relief members may have different protrusion patterns according to the patterns of the layers.

The present disclosure includes embodiments given below.

A manufacturing method for an electronic device includes (i) forming an insulating film on a surface of a cylinder, (ii) forming the insulating film having a via hole on the surface of the cylinder by pressing a relief member against the insulating film to remove a portion of the insulating film facing a protrusion of the relief member, and (iii) providing a precursor of an insulating layer having the via hole filled with conductive ink on a wiring substrate, wherein the via hole faces a wiring of the wiring substrate.

According to the above-described embodiment, the following special effects are provided.

Specifically, firstly, in a manufacturing method for an electronic device according to the present disclosure, the relief member is pressed against the insulating film to remove the portions of the insulating film facing the protrusions of the relief member, and thus the via holes for connection vias are easily formed. Secondly, in a manufacturing method for an electronic device according to the present disclosure, there is no adhesion of removed substances to a surface of the insulating layer, and thus the wiring formed on the connection vias in the insulating layer is not contaminated. Accordingly, failure of electrical connection between wirings via the connection vias is suppressed. Thirdly, in a manufacturing method for an electronic device according to the present disclosure, the via holes are airtightly and accurately filled with the conductive ink with the position and amount of the conductive ink appropriately adjusted. Accordingly, the reliability of electrical connection between the wirings via the connection vias is improved.

For example, the manufacturing method for an electronic device according to the above-described embodiment may further include setting the insulating film having the via hole.

For example, the manufacturing method for an electronic device according to the above-described embodiment may further include setting the precursor of the insulating layer to form the insulating layer having a connection via.

For example, the manufacturing method for an electronic device according to the above-described embodiment may further include filling the via holes with the conductive ink after forming the insulating film having the via hole on the surface of the cylinder.

For example, in the manufacturing method for an electronic device according to the above-described embodiment, the cylinder may be rotated on the wiring substrate to provide the precursor of the insulating layer having the via hole filled with the conductive ink on the wiring substrate.

For example, in the manufacturing method for an electronic device according to the above-described embodiment, the precursor of the insulating layer having the via hole filled with the conductive ink may be substantially flat.

For example, in the manufacturing method for an electronic device according to the above-described embodiment, the step of (iii) may include providing the insulating film having the via hole on the wiring substrate, and then filling the via hole with the conductive ink to form the precursor of the insulating layer.

For example, in the manufacturing method for an electronic device according to the above-described embodiment, the cylinder may be rotated on the wiring substrate to provide the insulating film having the via hole on the wiring substrate.

For example, in the manufacturing method for an electronic device according to the above-described embodiment, the wiring may be provided on a core substrate by use of the cylinder.

For example, in the manufacturing method for an electronic device according to the above-described embodiment, at least one selected from the group consisting of the wiring and an electrode may further be provided on the conductive ink filling the via hole by use of the cylinder.

For example, in the manufacturing method for an electronic device according to the above-described embodiment, at least one selected from the group consisting of the wiring and an electrode may further be provided on the connection via by use of the cylinder.

For example, in the manufacturing method for an electronic device according to the above-described embodiment, the via hole may be filled with the conductive ink by an ink jet method.

For example, in the manufacturing method for an electronic device according to the above-described embodiment, the cylinder may be made of polydimethylsiloxane.

For example, in the manufacturing method for an electronic device according to the above-described embodiment, the protrusions of the relief member may be a column, a quadrangular prism, or a combination of a column and a quadrangular prism.

For example, in the manufacturing method for an electronic device according to the above-described embodiment, at least one selected from the group consisting of a material of the insulating layer and the precursor of the insulating layer may be set by ultra-violet irradiation or electron beam irradiation.

A manufacturing method for an electronic device according to an embodiment of the present disclosure is applicable to a display device, such as a liquid crystal display device, an organic electroluminescence (EL) display device, an electrophoresis display device, an electronic liquid powder display device, a microencapsulated display device, an electro-chromic display device, or an electro-wetting display device, for example. A manufacturing method for an electronic device according to an embodiment of the present disclosure is also applicable to a physical sensor, a chemical sensor, a thin-film transistor (TFT), a radio frequency identification (RFID) tag, a logic circuit, a memory, a power transfer device, a touch panel, an electromagnetic shielding member, a flexible printed circuit (FPC), a circuit board, and so forth.

What is claimed is:

1. A manufacturing method for an electronic device comprising:
   (i) forming an insulating film on a surface of a cylinder;
   (ii) forming the insulating film having a via hole on the surface of the cylinder by pressing a relief member against the insulating film to remove a portion of the insulating film facing a protrusion of the relief member;
   (iii) filling the via hole with a conductive ink after forming the insulating film having the via hole on the surface of the cylinder; and
   (iv) providing the insulating film having the via hole on a wiring substrate,
   wherein the via hole faces a wiring of the wiring substrate, and
   wherein the cylinder is rotated on the wiring substrate to provide the insulating film having the via hole filled with the conductive ink on the wiring substrate.

2. The manufacturing method for an electronic device according to claim 1, further comprising setting the insulating film having the via hole.

3. The manufacturing method for an electronic device according to claim 1, wherein the insulating film having the via hole filled with the conductive ink is substantially flat.

4. The manufacturing method for an electronic device according to claim 1, wherein the wiring is provided on a core substrate by use of the cylinder.

5. The manufacturing method for an electronic device according to claim 1, wherein at least one selected from the group consisting of the wiring and an electrode is further provided on the conductive ink filling the via hole by use of the cylinder.

6. The manufacturing method for an electronic device according to claim 1, wherein the via hole is filled with the conductive ink by an ink jet method.

7. The manufacturing method for an electronic device according to claim 1, wherein the cylinder is made of polydimethylsiloxane.

8. The manufacturing method for an electronic device according to claim 1, wherein the protrusion of the relief member is a column, a quadrangular prism, or a combination of a column and a quadrangular prism.

9. The manufacturing method for an electronic device according to claim 2, wherein the insulating film having the via hole is set by ultra-violet irradiation or electron beam irradiation.

10. The manufacturing method for an electronic device according to claim 1, further comprising setting the insulating film having the via hole to form the insulating film having a connection via.

11. The manufacturing method for an electronic device according to claim 10, wherein at least one selected from the group consisting of the wiring and an electrode is further provided on the connection via by use of the cylinder.

* * * * *